United States Patent [19]

Chiang

[11] Patent Number: 5,486,776
[45] Date of Patent: Jan. 23, 1996

[54] ANTIFUSE-BASED PROGRAMMABLE LOGIC CIRCUIT

[75] Inventor: David Chiang, Saratoga, Calif.

[73] Assignee: Xilinx, Inc., San Jose, Calif.

[21] Appl. No.: 315,009

[22] Filed: Sep. 29, 1994

[51] Int. Cl.$^6$ .................................................. H03R 19/177
[52] U.S. Cl. ............................ 326/41; 326/39; 327/525; 257/50
[58] Field of Search .................................. 326/38–39, 41, 326/101; 327/525; 365/96, 104, 105, 225.7; 257/50, 530

[56] References Cited

U.S. PATENT DOCUMENTS

| | | | |
|---|---|---|---|
| 4,229,757 | 10/1980 | Moussie | 257/50 |
| 4,783,763 | 11/1988 | Bergman | 365/104 X |
| 5,233,206 | 8/1993 | Lee et al. | 365/225.7 X |
| 5,311,039 | 5/1994 | Kimura et al. | 257/530 X |
| 5,410,163 | 4/1995 | Murakami | 257/50 X |

*Primary Examiner*—David R. Hudspeth
*Attorney, Agent, or Firm*—Jeanette S. Harms

[57] ABSTRACT

A programmable interconnect is provided that includes a first plurality of lines, a second plurality of lines, and means for connecting one of the first plurality of lines to one of the second plurality of lines, wherein the means for connecting includes an antifuse and a diode. The diode in this configuration performs the equivalent logical function as an AND gate. Programing the antifuse determines the diode-AND gate function performed. In this manner, a programmable interconnect array in accordance with the present invention, formed using standard fabrication processes, provides an area-efficient implementation of a wide AND functionality.

6 Claims, 3 Drawing Sheets

5,486,776

ANTIFUSE-BASED PROGRAMMABLE LOGIC CIRCUIT

BACKGROUND OF THE INVENTION

1. Field of the Invention

The present invention relates to a programmable logic circuit, and in particular to an antifuse-based programmable logic circuit with a wide AND functionality.

2. Description of the Related Art

Programmable logic arrays are well known in the art. A programmable logic array (PLA) is a combinational, two-level AND-OR device that is programmed to realize predetermined sum-of-products logic expressions. Some PLAs, instead of using AND gates and OR gates, are built using bipolar, TTL technology. FIG. 1 illustrates PLA 100 which includes three input lines 101, 102, and 103 and three output lines 107, 108, and 109. Buffers 105 provide the signals on input lines 101, 102, and 103 and their complements to lines 110. Another set of lines, 109, are formed orthogonally to lines 110. A voltage source Vcc is provided through resistors 104 to each vertical line 109.

At each crossing 111A of line 110 and 109, a diode 112 is placed in series with a fuse 113 (see blow-up 114). Specifically, fuse 113 is coupled to one of lines 109 and diode 112 is coupled to one of lines 110. Diodes in this configuration perform the equivalent logical function as AND gates (explained in detail in reference to FIG. 4).

Inverters 106 invert the signals on lines 109 and provide those inverted signals to supply lines 118, thereby actually performing a NAND function. As shown in FIG. 1, lines 118 are formed orthogonally to lines 115. The voltage source Vcc is also provided to lines 115 through resistors 116. Once again, at each crossing 111B of one of lines 118 and one of lines 115, a fuse 113 is placed in series with a diode 112, wherein fuse 113 is coupled to one of lines 118 and diode 112 is coupled to one of lines 115. Inverters 117 invert the signals on lines 115, thereby providing a NAND-NAND function at output leads 107, 108, and 109. Note that a NAND-NAND function is equivalent to performing an AND-OR function.

However, the use of fuses in the above configuration results in several disadvantages. In order to program the desired pattern into the fuses, selected fuses are blown by applying a high current through those fuses until the resulting heat and large current destroy the conduction path. Each fuse requires a relatively large area in order to dissipate the heat generated during programming without damaging nearby circuitry. Additionally, large transistors are required in the programing circuitry to deliver the required programming current. Accordingly, a fusible link array is undesirably large, and the area does not scale with increasingly fine geometries used in the state-of-the-art fabrication processes.

Therefore, a need arises for a programmable logic circuit which provides the logic capability of a fusible link array while minimizing silicon area.

SUMMARY OF THE INVENTION

In accordance with the present invention, a programmable logic circuit includes a first plurality of lines, a second plurality of lines, and means for connecting one of the first plurality of lines to one of the second plurality of lines, wherein the means for connecting includes an antifuse and a diode connected in series. In one embodiment, the cathode of the diode is coupled to one of the first plurality of lines and the anode of the diode is coupled to the antifuse. In this embodiment, the antifuse is further coupled to one of the second plurality of lines. In other embodiments of the present invention, the position of the diode and antifuse are reversed.

Unlike the fuse, the antifuse is non-conductive in its initial state. Moreover, the programming circuitry does not need to support a large current before programming is complete, thereby reducing the size requirements for transistors in the programming path. Additionally, very little heat is generated during programming. In this manner, no additional area is needed for heat dissipation. Therefore, the present invention provides an area-efficient implementation.

In accordance with the present invention, a parasitic diode normally available as part of a standard antifuse fabrication process is used, and performs the equivalent logical function as an AND gate. Programming the antifuse determines the diode-AND gate function performed. Therefore, a programmable interconnect array in accordance with the present invention provides the logic capability of wide AND functionality in an area efficient implementation.

DETAILED DESCRIPTION OF THE DRAWINGS

Figure 1:
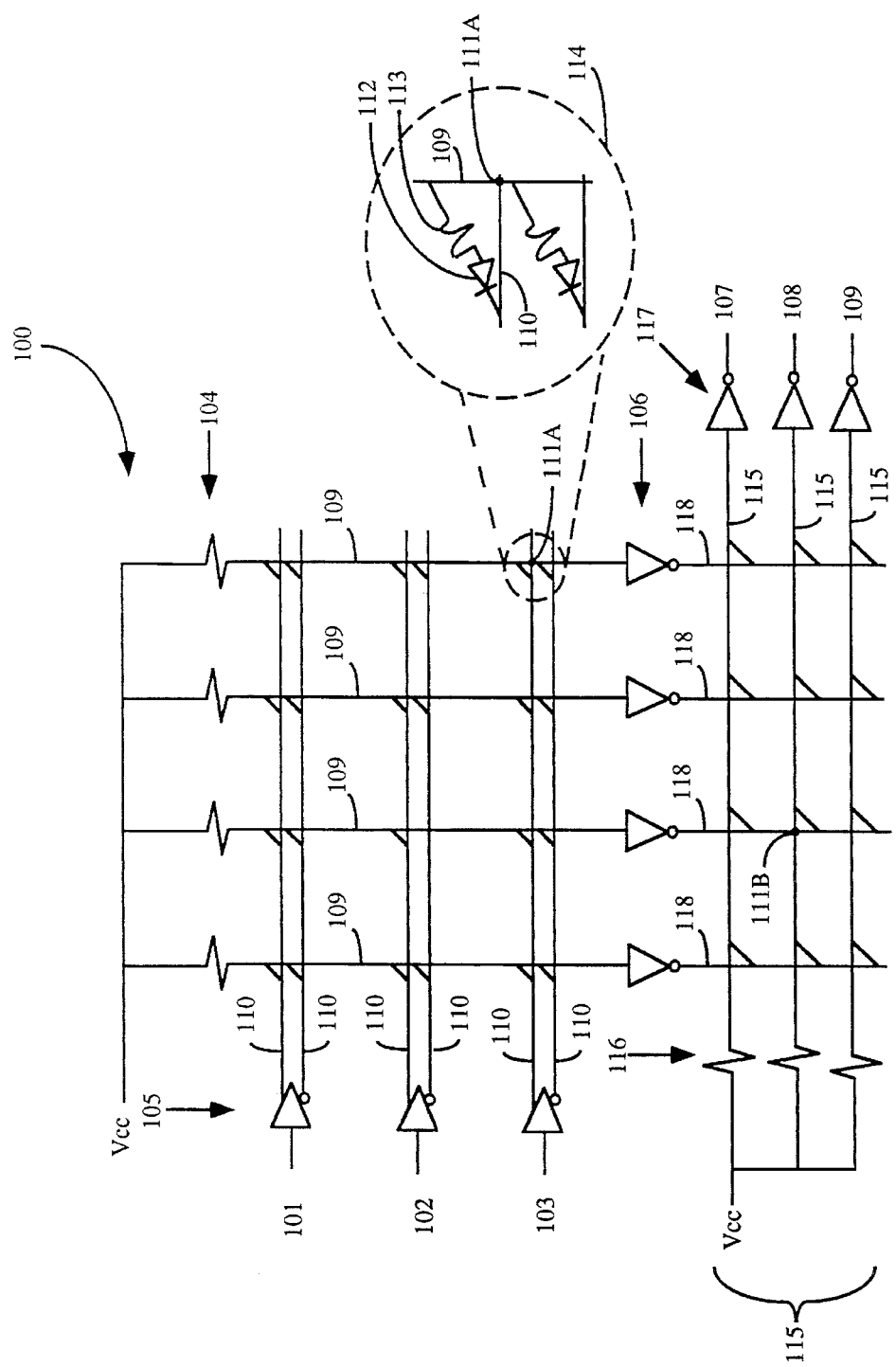
FIG. 1 illustrates a known bipolar PLA using diodes and fuses.
Figure 2:
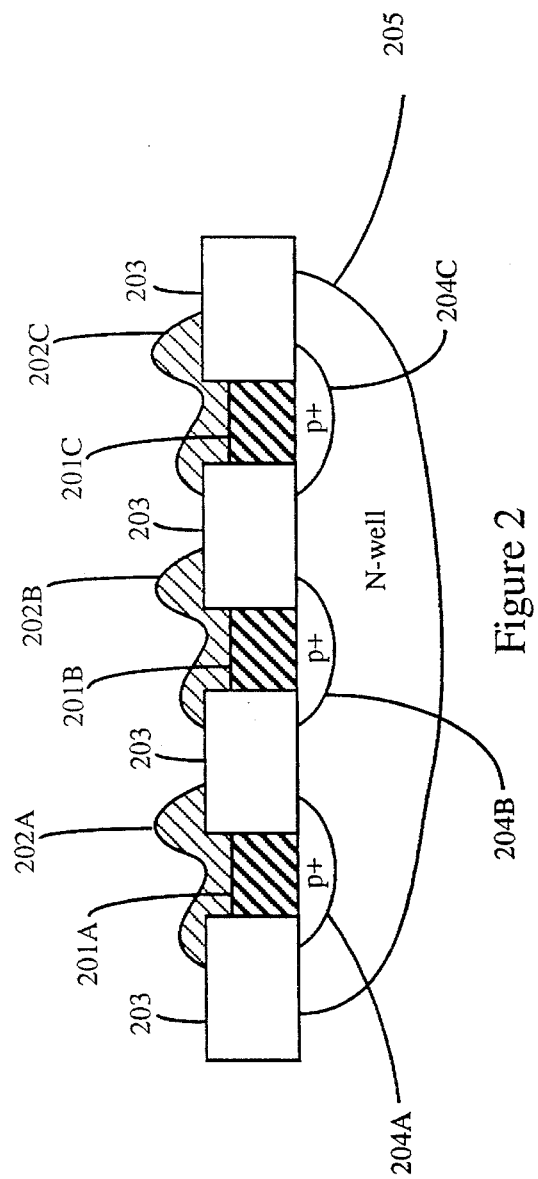
FIG. 2 shows a cross section of a plurality of antifuses and diodes in the present invention.

Antifuses are well-known in the art of integrated circuits. An antifuse is a structure which is non-conductive when manufactured, but becomes permanently conductive by applying a predetermined voltage across its terminals. In accordance with the present invention, an antifuse replaces each fuse 113 in FIG. 1. Referring to FIG. 2, antifuses 201A, 201B, and 201C are formed on p+ diffusion areas 204A, 204B, and 204C, respectively, in an N-well area 205. Conductive lines 202A, 202B, and 202C are formed over antifuses 201A, 201B, and 201C, respectively. Field oxide regions 203 isolate antifuses 201A, 201B, and 201C from one another.

Figure 3:
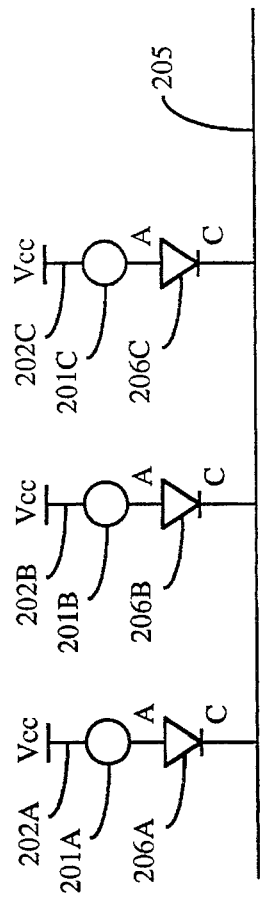
FIG. 3 illustrates the circuit equivalent of the antifuses and diodes shown in FIG. 2.

A plurality of parasitic diodes are formed between p+ diffusion areas 201A, 201B, and 201C and N-well area 205. FIG. 3 illustrates the equivalent circuit shown in cross-section in FIG. 2. The diffused p+ diffusion areas 204A, 204B, and 204C (FIG. 2) in combination with N-well area 205 form diodes 206A, 206B, and 206C (FIG. 3), respectively. Each diode has a common cathode C (the electrical equivalent of N-well area 205). In one embodiment of the present invention, the circuit shown in FIG. 3 is used in a programmable interconnect array, and replaces diodes 112 and fuses 113 in FIG. 1. Note that lines 110 and 109 (as well as lines 118 and 115) of FIG. 1 correspond to N-well area 205 and conductive lines 202 of FIG. 3, respectively. Because the present invention uses antifuses, the present invention provides a programmable logic circuit with the logic capability of wide AND functionality while significantly reducing the area necessary to implement an array in comparision to a prior art interconnect array including fuses.

Figure 4:
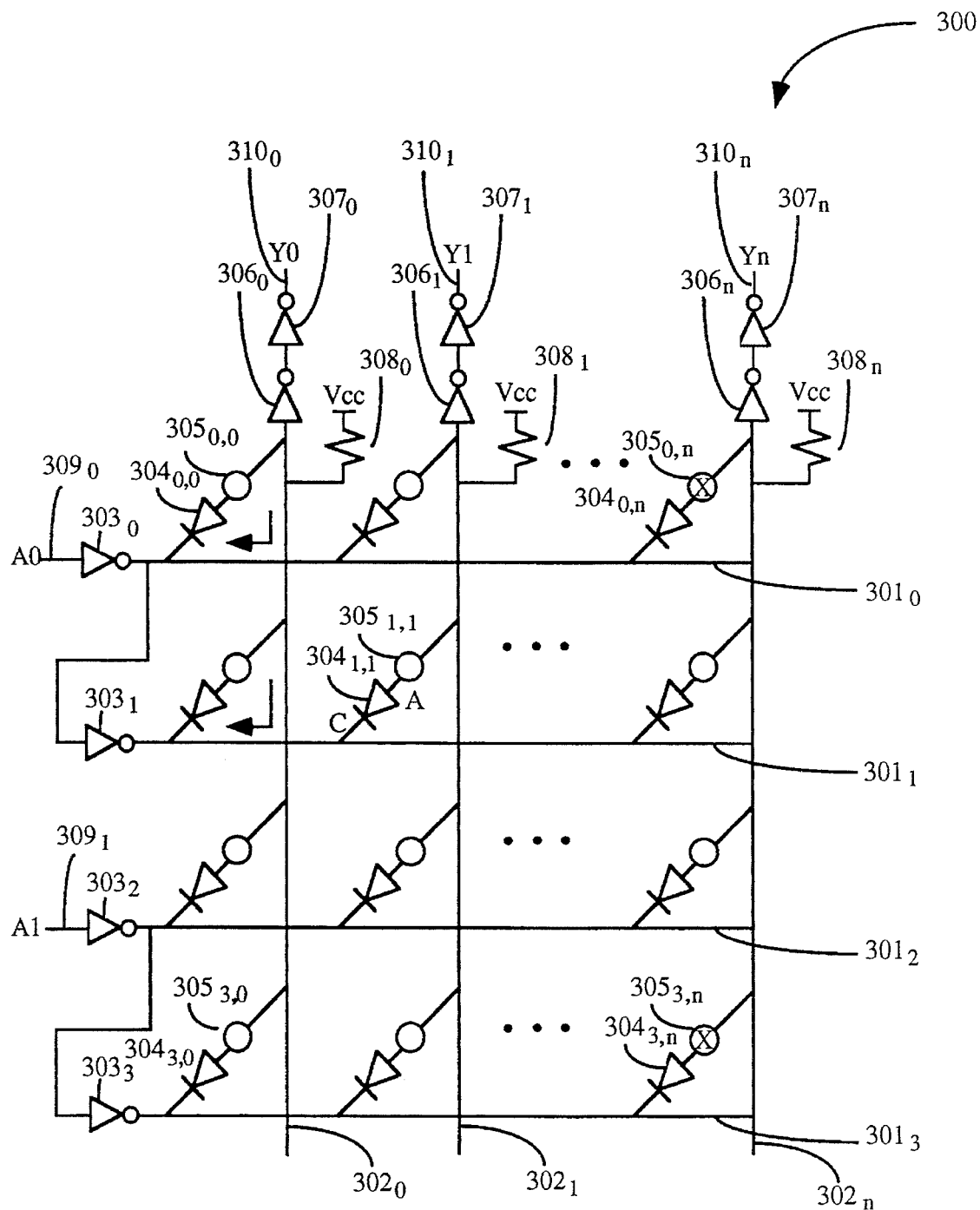
FIG. 4 shows a programmable logic circuit using diodes and antifuses in accordance with the present invention.

Referring to FIG. 4, a programmable interconnect array 300 in accordance with one embodiment of the present invention includes input lines $309_0$ and $309_1$ and output lines $310_0$–$310_n$. Buffers 303 provide the signals A0 and A1, and their complements, to lines 301. For example, inverter $303_0$ inverts signal A0, thereby providing signal $\overline{A0}$ to line $301_0$. Inverter $303_1$ inverts signal $\overline{A0}$ thereby providing signal A0, to line $301_1$. Another set of lines $302_0$–$302_n$ are formed orthogonally to lines $301_0$–$301_3$. A voltage source Vcc is provided through resistors $308_0$–$308_n$ to lines $302_0$–$302_n$, respectively, thereby providing a pull-up on those lines.

A diode 304 is placed in series with a fuse 305 at each crossing of a line 301 and a line 302. Specifically, the cathode C of diode $304_{1,1}$ for example, is coupled to line $301_1$, the anode A of diode $304_{1,1}$ is coupled to antifuse $305_{1,1}$, wherein antifuse $305_{1,1}$ is further coupled to line $302_1$.

Referring to FIG. 4, a diode 304 in this configuration performs the equivalent logical function as an AND-gate, and provides that logic function output signal on a line 302. Each line 302 is subsequently buffered by two inverters 306 and 307 to provide a true output signal on an output line 310. Note that each line 302 has a weak pullup resistor 308 which ensures a logic high signal on output line 310 if the signal is not pulled low by a programmed antifuse 305. Specifically, programming a selected subset of the antifuses supplies a pull down current on those input lines 301 coupled to the programmed antifuses. Because of the orientation of diodes 304 in series with antifuses 305, only a low voltage is conducted through diodes 304 (i.e. diodes 304 are reverse biased and therefore cannot conduct a high voltage). Therefore, lines 302 are a logic low if and only if one or more selected input lines 301 are at a low state, with the selection made by programming the corresponding antifuses. Thus, lines 302 perform a AND function with the signals provided on selected input lines 301.

For example, in the embodiment shown in FIG. 4, antifuses $305_{0,n}$ and $305_{3,n}$ are programmed (indicated by crosses) in order to implement the function Yn=$\overline{A0}$*A1. Assuming that signal A0 is a logic zero, line $301_0$ provides a logic one signal, thereby preventing any current flow through diode $304_{0,n}$. Further assuming that signal A1 is a logic zero, line $301_3$ provides a logic zero signal. In turn, this low signal causes diode $304_{3,n}$ to conduct, thereby transferring the low signal through programmed antifuse $305_{3,n}$ to line $302_n$. This low signal overpowers the weak pull-up provided by resistor $308_n$ and pulls down line $302_n$ to approximately 0.6 V. Inverting buffer $306_n$ interprets a voltage level of 0.6 V as a logic zero thereby assuring a logic zero signal is provided on output line $310_n$. Note that the input signals on both lines $301_1$ and $301_2$ are irrelevant to the output signal because the corresponding antifuses on those lines are not programmed.

If input signal A0 is a logic zero whereas input signal A1 is a logic one, then both lines $301_0$ and $301_3$ provide a logic one signal. In that case, diodes $304_{0,n}$ and $304_{3,n}$ do not conduct, thereby ensuring that line $302_n$ retains its logic one signal. If input signal A0 is a logic one and input signal A1 is a logic zero, then both lines $301_0$ and $301_3$ provide a logic zero signal. In that case, both diodes $304_{0,n}$ and $304_{3,n}$ conduct, hereby pulling down the voltage on line $302_n$ to approximately 0.6 V. Therefore, output line $310_n$ provides a logic zero signal. Similarly, if input signal A0 and input signal A1 are both logic ones, then line $301_0$ provides a logic zero signal, thereby pulling down the voltage on line $302_n$ to approximately 0.6 V. Once again, output line $310_n$ provides a logic zero signal.

Therefore, as shown in FIG. 4, the function Yn=$\overline{A0}$*A1 is implemented by programming antifuses $305_{0,n}$ and $305_{3,n}$. One skilled in the art will appreciate that any AND function involving input signal A0 and input signal A1 can be implemented in the programmable array of FIG. 4. Thus, a programmable interconnect array in accordance with the present invention provides a programmable logic circuit with the logic capability of wide AND functionality with an area efficient implementation.

The above-described embodiment of the present invention is illustrative only and not limiting. Other embodiments of the present invention will be apparent to those skilled in the art. The present invention is set forth in the appended claims.

I claim:

1. A programmable logic circuit comprising:

a first plurality of lines;

a second plurality of lines;

means for connecting at least one of said first plurality of lines to at least one of said second plurality of lines, wherein said means for connecting includes an antifuse and a diode connected in series, wherein said antifuse is formed over a diffusion area in a well area, and said diode is formed from said diffusion area and said well area.

2. The programmable interconnect of claim 1 wherein the anode of said diode is coupled to said antifuse and the cathode of said diode is coupled to said one of said first plurality of lines.

3. The programmable interconnect of claim 2 wherein said antifuse is further coupled to said one of said second plurality of lines.

4. The programmable interconnect of claim 3 further comprising a resistance coupled to said one of said second plurality of lines.

5. The programmable interconnect of claim 4 further comprising a voltage source coupled to said resistance.

6. A method for providing a wide fan-in functionality comprising the steps of:

interconnecting two sets of conductive lines with programmable means, wherein said programmable means includes a diode and an antifuse connected in series, wherein said antifuse is formed over a diffusion area in a well area, and said diode is formed from said diffusion area and said well area.

* * * * *

UNITED STATES PATENT AND TRADEMARK OFFICE
CERTIFICATE OF CORRECTION

PATENT NO. : 5,486,776
DATED : January 23, 1996
INVENTOR(S) : David Chiang It is certified that error appears in the above-identified patent and that said Letters Patent is hereby corrected as shown below:

Col. 2, line 67, delete "comparision" and insert -- comparison --.

Col. 3, line 35, delete "a" and insert -- an --.

Signed and Sealed this

Thirteenth Day of May, 1997

*Attest:*

BRUCE LEHMAN

*Attesting Officer*     *Commissioner of Patents and Trademarks*